United States Patent [19]

Simko et al.

[11] 3,996,657
[45] Dec. 14, 1976

[54] DOUBLE POLYCRYSTALLINE SILICON GATE MEMORY DEVICE

[75] Inventors: Richard T. Simko; Phillip J. Salsbury, both of Sunnyvale, Calif.

[73] Assignee: Intel Corporation, Santa Clara, Calif.

[22] Filed: Jan. 13, 1976

[21] Appl. No.: 648,828

Related U.S. Application Data

[62] Division of Ser. No. 537,265, Dec. 30, 1974, Pat. No. 3,984,822.

[52] U.S. Cl. .................................. 29/571; 357/23; 357/59
[51] Int. Cl.[2] .......................................... B01J 17/00
[58] Field of Search ............... 29/571, 578; 357/23, 357/59

[56] References Cited
UNITED STATES PATENTS 3,500,142  3/1970  Kahvg ................................ 357/23
3,590,471  7/1971  Lapselter ............................ 29/571
3,761,327  9/1973  Harlow ............................... 357/59

*Primary Examiner*—W. Tupman
*Attorney, Agent, or Firm*—Blakely, Sokoloff, Taylor & Zafman

[57] ABSTRACT

A double polycrystalline silicone gate memory device having a floating gate for storing charge and a control gate. The memory device may be used as a single device cell in a memory array. A double self-aligning method is used to form the source and drain regions while doping the gates. Through a predeposition step a lightly doped secondary source and drain regions are formed in alignment with the floating gate prior to the formation of the primary source and drain regions in alignment with the control gate.

9 Claims, 9 Drawing Figures

DOUBLE POLYCRYSTALLINE SILICON GATE MEMORY DEVICE

This is a divisional of application Ser. No. 537,265, filed Dec. 30, 1974, now U.S. Pat. No. 3,984,822.

BACKGROUND OF THE INVENTION

1. Field of the Invention

The invention relates to the field of floating gate devices, Classes 317/235R, 340/173R.

2. Prior Art

Memory devices, particularly metal-oxide-semiconductor (MOS) devices which include floating gates, have been utilized for the storage of information in the prior art. One such device is shown in U.S. Pat. No. 3,500,142; in this device the tunneling phenomena is utilized to charge a floating gate. Another device which utilizes avalanche injection for charging a floating gate (without the use of a second gate) is shown in U.S. Pat. No. 3,660,819. Other pertinent prior art is shown in U.S. Pat. Nos. 3,755,721; 3,825,946; 3,797,000. Memory arrays which employ such floating gate devices are disclosed in U.S. Pat. Nos. 3,728,695 and 3,744,036.

The present invention discloses a floating gate device which includes a second gate or control gate. The device employs two separate layers of polycrystalline silicon, one for the floating gate and the other for the control gate. The use of double level polycrystalline silicon in semi-conductor devices is known in the prior art, for example, see IEEE Spectrum, Sept. 1973, page 85, "New Product Applications".

SUMMARY OF THE INVENTION

A memory device which may be utilized as a cell in a memory array is disclosed. The device includes a pair of spaced apart regions, a source region and a drain region disposed in a silicon substrate. A first gate (floating gate) is disposed above the channel defined by the source and drain regions and completely surrounded by a oxide. A second gate or control gate is disposed above the floating gate and insulated from the floating gate. Both the floating gate and control gate comprise polycrystalline silicon which is heavily doped. The source and drain regions each comprise a primary region and a secondary region. The secondary regions are more lightly doped than the primary regions and are in substantial alignment with the sides of the floating gate. The primary regions are in substantial alignment with the sides of the control gate. The device may be electrically programmed and electrically erased, or erased utilizing ultraviolet radiation. A charge on the floating gate substantially alters the threshold voltage of the device, hence providing a memory device.

The device of the present invention permits the fabrication of a high density memory array, such as a PROM (programmable read-only-memory). Since each memory device may act as a cell in the array (that is, no additional gating devices are required for each cell), higher density arrays are achievable. This higher density permits fabrication of memories at reduced cost when compared to prior art PROMs. Moreover, the presently disclosed device takes advantage of "poly-poly" construction, that is, two separate polycrystalline silicon layers. Such construction has fabrication advantages over prior art memory devices which have employed double metal gates or a single polycrystalline silicon gate and a metal gate.

DETAILED DESCRIPTION OF THE INVENTION

Figure 7:
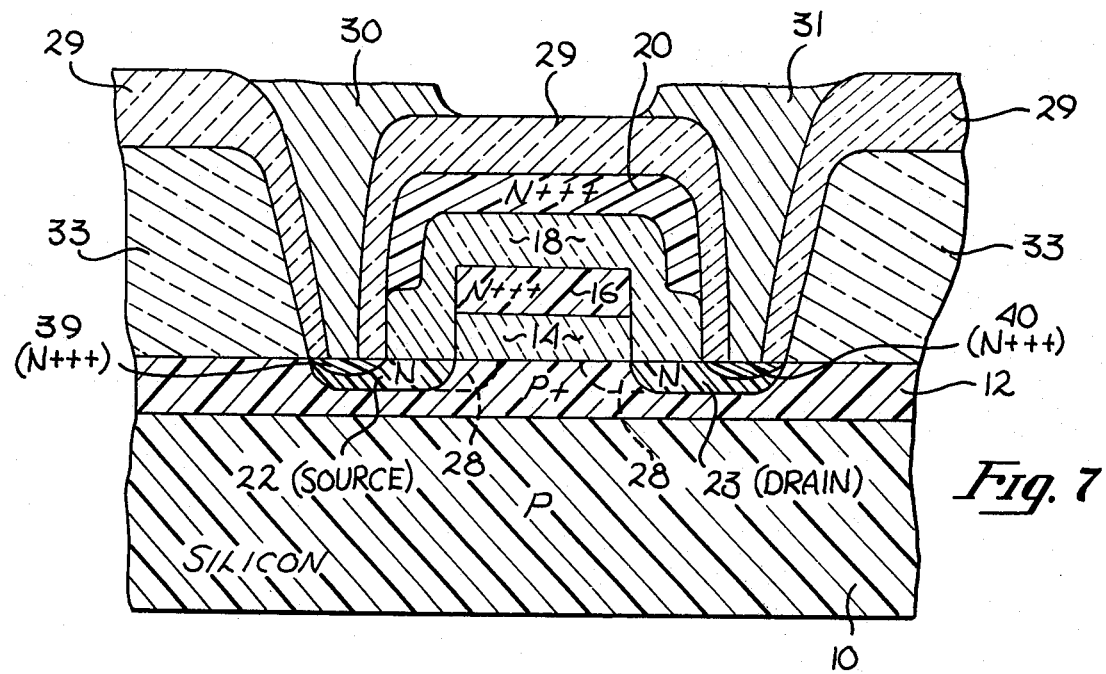
FIG. 7 is a cross sectional view of a completed device.

Referring first to FIG. 7, a completed memory device is shown fabricated on a substrate 10. In the presently preferred embodiment, a p-type polycrystalline silicon substrate is employed with an impurity level of approximately $2 \times 10^{15}$ atoms/cm$^3$. The upper surface of the substrate is ion implanted (boron implanted) to raise the impurity level by an order of magnitude to approximately $2-5 \times 10^{16}$ atoms/cm$^3$; this implanted area, shown as layer 12, is the host material for the cell or cells. In the presently preferred embodiment the cell of FIG. 7 is fabricated as part of a memory with the peripheral memory circuitry fabricated on the same substrate as are the cells. Those portions of the substrate containing the cells are ion implanted while the remainder of the substrate, that is, the portion which contains the periphery circuits, is fabricated on the more lightly doped substrate. In the event that a more lightly doped substrate is not required, the entire substrate may be more highly doped to form a suitable substrate for the cells.

The cell of FIG. 7 includes a floating gate 16 disposed above and between the channel defined by the source and drain regions. The floating gate 16 is used for storing electrical charge and is completely surrounded by thermally grown oxide. A second or control gate 20 is insulated from and disposed above the floating gate 16. Both the control gate 20 and the floating gate 16 are highly doped polycrystalline silicon structures. A gate oxide layer 14, which is a thermally grown silicon dioxide, separates the floating gate 16 from the substrate and a thermally grown oxide, layer 18, separates the floating gate 16 from the control gate 20. Field oxides layers 29 and 33 cover the entire device and substrate except for the metal contacts 30 and 31 and form a contact region to the control gate 20 which is not illustrated.

The source regions include a highly doped primary region 39 which is disposed within a "shadow" or lightly doped secondary region 22. Likewise, the drain includes a primary drain region 40 which is heavily doped and a more lightly doped shadow or secondary drain region 23. The secondary source and drain regions 22 and 23 are in alignment with the sides of floating gate 16, while the primary source and drain regions 39 and 40 are in alignment with the sides of the control gate 20. The fabrication of the primary and secondary source and drain regions will be discussed later in this application.

Figure 8:
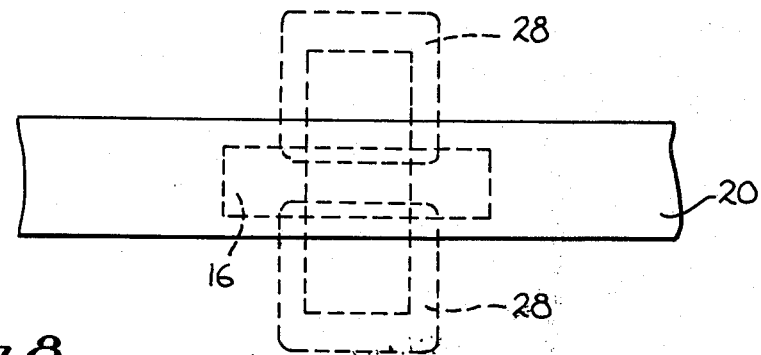
FIG. 8 is a partial plan view of the device of FIG. 7.

Some lateral diffusion does occur after the source and drain regions have been initially defined as shown by regions 28. Referring briefly to FIG. 8, these lateral diffused regions are again illustrated. (Note that in FIG. 8 the control gate 20 is elongated and in the presently preferred embodiment of the cell (and memory array) the gate 20 extends laterally over a row or column of cells.) It is estimated that the final channel width due to the lateral diffusions is approximately 2 microns. If more heavily doped regions were utilized instead of the lightly doped secondary source and drain regions, more lateral diffusion would occur during subsequent processing steps which would decrease the channel width, causing "punch-through" problems.

Figure 1:
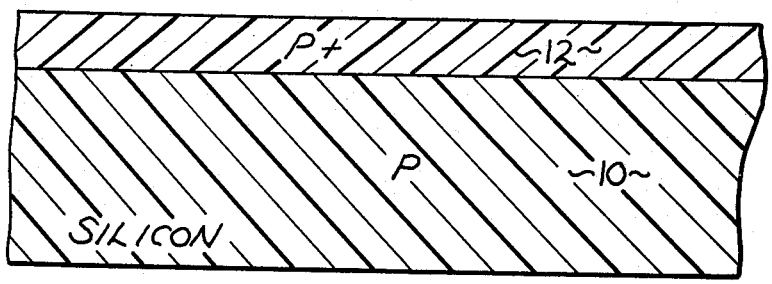
FIG. 1 illustrates a cross sectional view of a substrate upon which a memory device fabricated in accordance with the present invention is to be produced, the substrate includes an ion implanted layer.

Referring now to FIG. 1, the fabrication of the cell or memory device begins with the ion implantation in order to form the more highly doped layer 12. In the presently preferred embodiment where periphery circuits are also deployed on the same substrate 10 other pre-cell fabrication steps occur such as defining channel stop regions.

Figure 2:
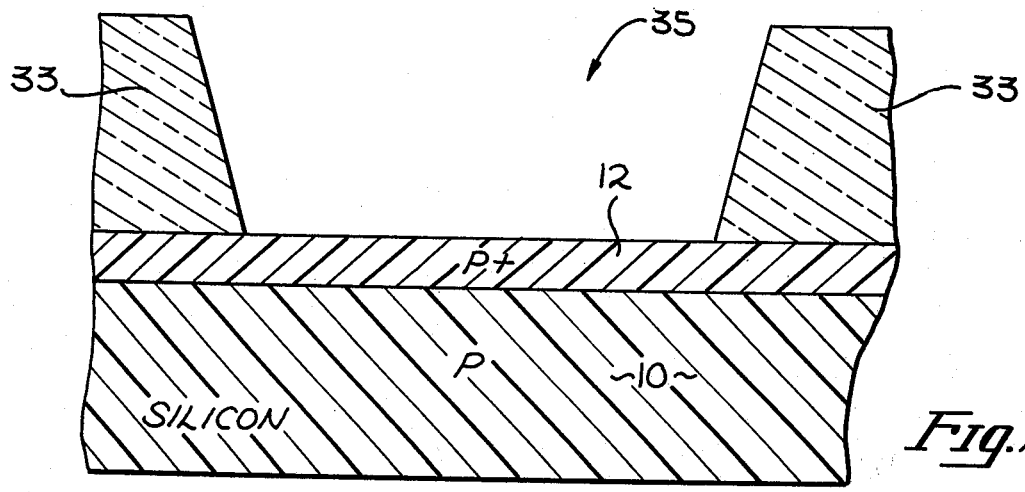
FIG. 2 illustrates the substrate of FIG. 1 after the next steps in the construction of the memory device have been performed and includes the fabrication of a window for receiving the memory device.

After the ion implantation a relatively thick field oxide layer 33 is grown on the substrate utilizing commonly known techniques. In the presently preferred embodiment the oxide is approximately 1 micron thick. Following this a source, drain and active gate area 35 is etched so as to expose the underlying layer 12 (FIG. 2). It will be appreciated that on the substrate a plurality of such areas 35 may be simultaneously defined in order that a plurality of cells may be simultaneously fabricated on the host layer 12.

Figure 3:
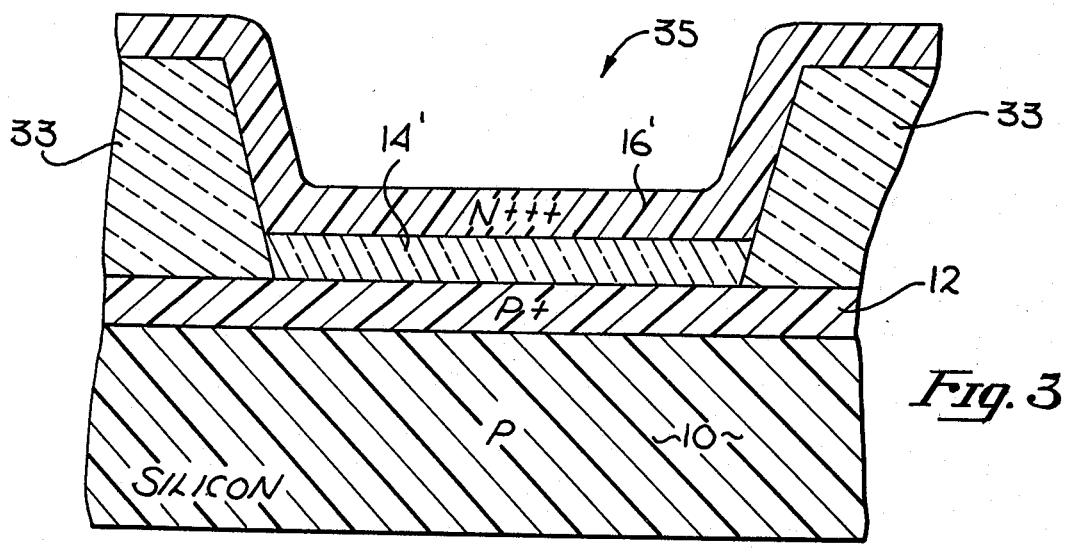
FIG. 3 illustrates the substrate of FIG. 2 after completion of the fabrication steps which follow FIG. 2 and includes the formation of an insulative layer and a polycrystalline silicon layer.

After the areas 35 have been defined an insulative layer 14' (which eventually becomes the floating gate oxide) is thermally grown to a thickness of approximately 1000 A in the presently preferred embodiment. Following this a polycrystalline silicon layer 16' which eventually becomes the floating gate 16, is deployed on the oxide layer 14' (FIG. 3). In the presently preferred embodiment the thickness of the layer 16' is approximately 4500 A. The layer 16 is highly doped with an n-type dopant (phosphorous) in an ordinary diffusion step.

Figure 4:
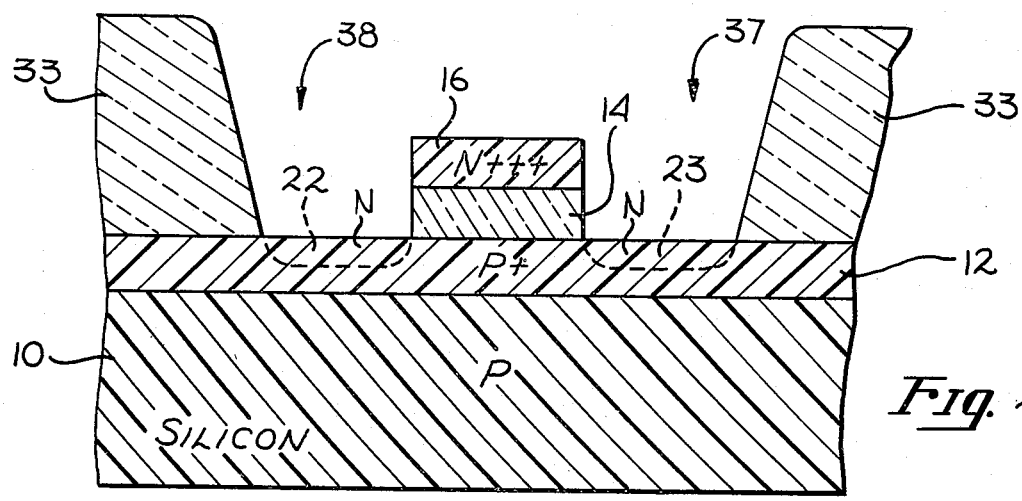
FIG. 4 illustrates the next steps i the fabrication of the memory device (following FIG. 3) and shows the formation of the floating gate and floating gate oxide and the formation of the secondary source and gain regions.

In FIG. 4 the substrate 10 is shown after the source window 38 and drain window 37 have been defined through the layers 14' and 16'. The silicon layer 16 is etched with an ordinary etching step and then the substrate 10 is dipped to remove the oxide layer 14' from the windows 37 and 38. At the point of the process illustrated in FIG. 4 the gate oxide layer 14 and the floating gate 16 are defined. The deposition of the n-type impurities to form the secondary source region 22 and secondary drain region 23 is illustrated in FIG. 4; this step follows the formation of the windows 37 and 38. This predeposition as previously mentioned, produces lightly doped regions which are in alignment with the sides of the floating gate 16. As mentioned, by use of these lightly doped regions the "punch-through" problems associated with lateral diffusion from more heavily doped regions are minimized. These regions, since they extend at least to the floating gate, allows the gate to be more easily charged.

The light predeposition defining the regions 22 and 23 of FIG. 4 may be doped by ordinary diffusion techniques or this shallow doping may be accomplished with the use of ion implantation.

It may be desirable to dope the gate 16 and the regions 22 and 23 (FIG. 4) at the same time, giving a lightly doped floating gate 16. In some applications, particularly for electrically erasable devices, the gate 16 may be doped with a p-type dopant prior to forming the windows 37 and 38.

Figure 5:
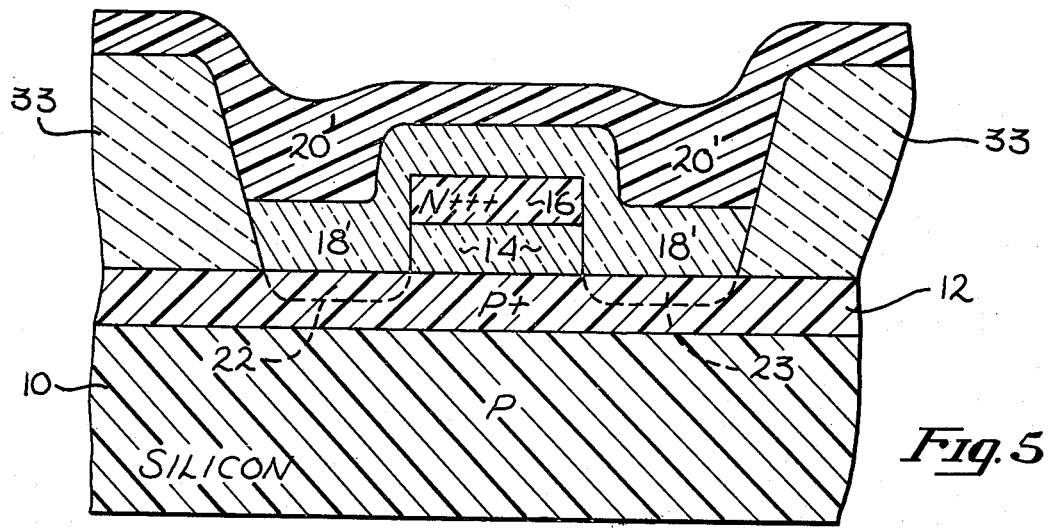
FIG. 5 illustrates the substrate of FIG. 4 with the formation of an additional insulative layer and additional polycrystalline silicon layer.

Referring to FIG. 5, after the formation of regions 22 and 23 illustrated in FIG. 4, a second gate oxide, layer 18' is thermally grown so as to cover the floating gate 16. In the presently preferred embodiment this oxide is approximately 1500 A thick. Following the formation of the second gate oxide a second polycrystalline layer 20' is grown above the second gate oxide. This layer, shown as layer 20' in FIG. 5, in the presently preferred embodiment is approximately 3000 A thick.

Figure 6:
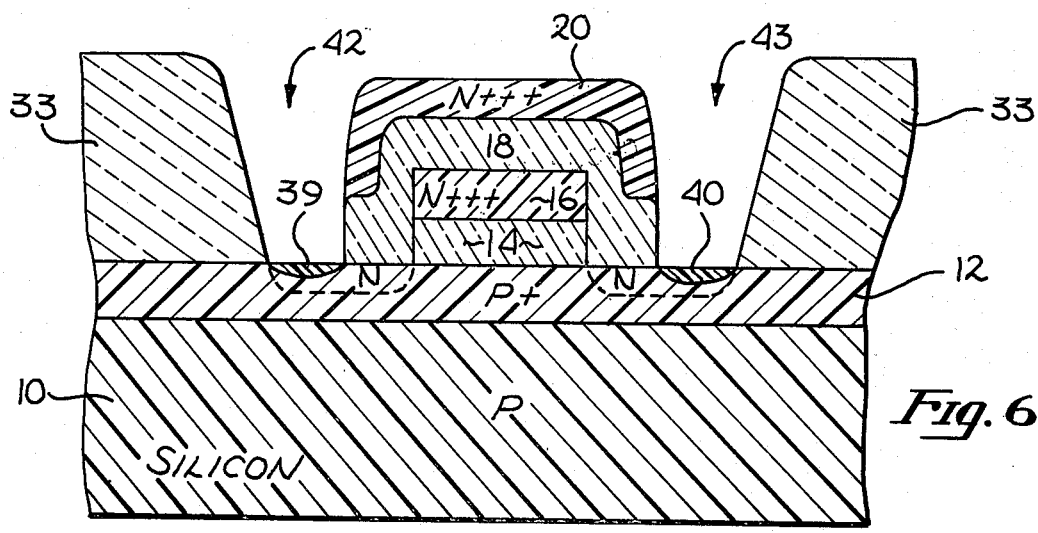
FIG. 6 illustrates the substrate of FIG. 5 with the formation of the primary source and drain windows and the definition of the second gate.

Following the deposition of the second polycrystalline silicon layer standard photo etching techniques are utilized in order to define the primary source window 42 and primary drain window 43 (FIG. 6). During these etching steps the gate oxide layer 18 and the control gate 20 are defined. After this etching step an ordinary diffusion step may be utilized in order to highly dope (n-type) the control gate 20, the primary source region 39 and primary drain region 40. After the formation of the primary source and drain regions, commonly known techniques may be utilized in order to deposit the field oxide layer 29, and then, to form the contacts 30 and 31 which may be metal contacts or other types of contacts such as semiconductor contacts. In the presently preferred embodiment the oxide layer 29 is approximately 1 micron thick.

It should be noted that the polycrystalline floating gate 16 is completely surrounded by thermally grown oxide. Since this oxide is of a relatively high quality, the rate at which charge escapes from the floating gate 6 is relatively low when compared to prior art floating gate devices.

The completed cell illustrated in FIG. 7 may be utilized as part of a PROM which may be electrically erased. In the presently preferred embodiment the device shown in FIG. 7 is utilized as a cell in a read-only-memory where erasing is accomplished by subjecting the device (or an entire array of devices) to ultraviolet radiation. A memory utilizing the device of FIG. 7 is disclosed in copending application Ser. No. 546,546 filed Feb. 3, 1975, now U.S. Pat. No. 3,938,108, assigned to the assignee of the present application.

Figure 9:
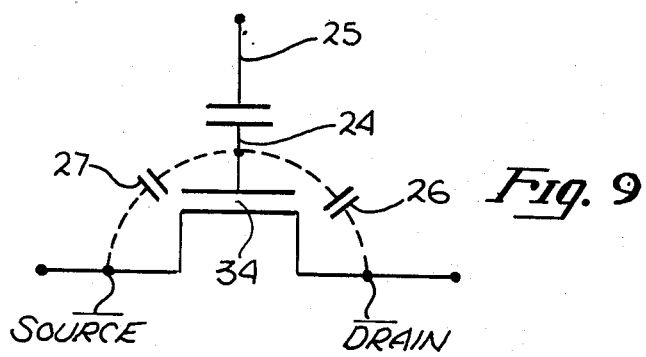
FIG. 9 is an electrical equivalent circuit for the memory device of the present invention.

Referring to FIG. 9, an electrical equivalent circuit of the device of FIG. 7 is illustrated and includes a source and drain terminal and a terminal 25 which is coupled to the control gate 20. Node 24 represents the floating gate and the capacitance between node 24 and the terminal 25 is that capacitance primarily associated with the second gate oxide layer 18. The capacitance between the floating gate and substrate which is associated with the first gate oxide layer 14 is illustrated as capacitance 34. The parasitic capacitance between node 24 and the source is illustrated as capacitor 27, while the parasitic capacitance between node 24 and the drain is shown as capacitance 26.

For the n-channel device illustrated in FIG. 7 the device becomes less conductive, that is, its threshold voltage becomes greater (in the positive sense) when the floating gate 16 is electrically charged. Of course, if the device of FIG. 7 were fabricated on an n-type substrate and included a p-type channel as may be done, the opposite would occur. When utilizing the device of the present invention, by way of example, the threshold voltage, that is, the gate voltage at which the device begins to readily conduct, is approximately 4 volts. The threshold voltage when the floating gate 16 is charged may shift by 8 to 10 volts. Thus, a significant difference in threshold voltage exists between a charged (or programmed) device and an uncharged (or non-programmed) device. This difference in potential allows a memory array to be fabricated from these devices where each cell of the memory array includes only the device, that is, no other gating devices are required.

In order to program the device of FIG. 7, that is, to place an electrical charge on the floating gate 16, the source region (contact 30) and substrate are held at a common potential, such as ground; a positive potential, for example, 20 volts, is applied to the drain region (contact 31); and a positive potential, for example, 25 volts, is applied to the control gate 20. These positive potentials may be pulses having pulse widths again by way of example, of the order magnitude of 10 milliseconds. When these conditions are met it is apparent that the device is in saturation and that a large depletion region or layer exists beneath the inversion layer. Hot electrons from the depletion layer penetrate the gate oxide layer 14 and become trapped on the floating gate 16. This hot carrier injection through the gate oxide layer 14 occurs when the electrons have sufficient energy to jump the energy bandgap associated with the interface of the silicon substrate and the silicon dioxide gate oxide layer 14.

In order to remove the charge from the floating gate 16 the device may be subjected to ultraviolet radiation or other radiation, or the charge may be removed electrically. The charge may be removed electrically by coupling the substrate and source and drain region terminals to a common potential such as ground, and by the application of a large positive voltage to the control gate 20. It may also be possible to remove the charge by the injection of holes onto the floating gate.

Thus, a floating gate memory device has been disclosed that may constitute a cell in a memory array without the use of a gating device or devices. The invented memory device may be charged with lower voltages than associated with prior art avalanche injection devices, thus permitting "on chip" decoding for programming. Fabrication advantages are achieved through a double self-aligning technique. The device may be fabricated with known MOS technology.

We claim:
1. A method for fabricating a double polycrystalline silicon memory device on a substrate comprising the steps of:
   forming a first insulative layer on said substrate;
   forming a first polycrystalline silicon gate over said first insulative layer;
   defining first source and drain regions on said substrate adjacent to said first insulative oxide and said first gate;
   doping said first source and drain regions;
   forming a second insulative layer over said first gate;
   forming a second polycrystalline silicon gate over said second insulative layer;
   defining second source and drain regions within said first source and drain regions;
   doping said second source and drain regions;
   whereby a memory device is formed on said substrate.
2. The method set forth in claim 1 wherein said first gate is doped prior to defining said first source and drain regions.
3. The method set forth in claim 2 wherein said second gate is doped simultaneously with the doping of said second source and drain regions.
4. The method set forth in claim 3 wherein the concentration of dopant in said first source and drain region is substantially less than the concentration of dopant in said second source and drain regions.
5. The method set forth in claim 4 wherein said first source and drain regions are doped by ion implantation.
6. The method set forth in claim 4 wherein said first source and drain regions are doped by diffusion.
7. The method set forth in claim 4 wherein said substrate is of the p-conductivity type and said source and drain regions and said first and second gates are of the n-conductivity type.
8. The method set forth in claim 7 wherein said substrate is ion implanted prior to the fabrication of said memory device.
9. The method set forth in claim 1 wherein said first gate is used to align said first source and drain regions and said second gate is used to align said second source and drain regions.

* * * * *

UNITED STATES PATENT OFFICE
CERTIFICATE OF CORRECTION

Patent No. 3,996,657   Dated December 14, 1976

Inventor(s) Richard T. Simko et al.

It is certified that error appears in the above-identified patent and that said Letters Patent are hereby corrected as shown below:

Column 2, line 15, after "steps" should read -- in --.

Column 4, line 44, after "gate" should read -- 6--.

Signed and Sealed this nineteenth Day of July 1977

[SEAL]

Attest:

RUTH C. MASON
Attesting Officer

C. MARSHALL DANN
Commissioner of Patents and Trademarks